(12) United States Patent
Satoh et al.

(10) Patent No.: US 9,370,104 B2
(45) Date of Patent: Jun. 14, 2016

(54) LID BODY PORTION AND ELECTRONIC DEVICE PACKAGE USING THE LID BODY PORTION AND ELECTRONIC DEVICE

(71) Applicants: Seiko Instruments Inc., Chiba-shi, Chiba (JP); KAGA, INC., Yokohama-shi, Kanagawa (JP)

(72) Inventors: Masayuki Satoh, Chiba (JP); Kenji Takano, Chiba (JP); Mitsuo Akiba, Chiba (JP); Hitoshi Takeuchi, Chiba (JP); Shuhei Kaneko, Yokohama (JP)

(73) Assignees: SEIKO INSTRUMENTS INC., Chiba-Ken (JP); KAGA, INC., Kanagawa (JP)

( * ) Notice: Subject to any disclaimer, the term of this patent is extended or adjusted under 35 U.S.C. 154(b) by 210 days.

(21) Appl. No.: 14/331,811

(22) Filed: Jul. 15, 2014

(65) Prior Publication Data

US 2015/0022988 A1    Jan. 22, 2015

(30) Foreign Application Priority Data

Jul. 16, 2013  (JP) .................................. 2013-147628

(51) Int. Cl.
| | |
|---|---|
| H05K 1/18 | (2006.01) |
| H01L 23/04 | (2006.01) |
| H01L 23/055 | (2006.01) |
| H05K 1/03 | (2006.01) |
| H05K 1/11 | (2006.01) |

(52) U.S. Cl.
CPC ................ H05K 1/181 (2013.01); H01L 23/04 (2013.01); H05K 1/0306 (2013.01); H05K 1/115 (2013.01); H01L 23/055 (2013.01); H01L 2924/0002 (2013.01)

(58) Field of Classification Search
CPC ..... H05K 1/181; H05K 1/115; H05K 1/0306; H01L 23/04; H01L 23/055
USPC ......................................................... 361/772
See application file for complete search history.

(56) References Cited

U.S. PATENT DOCUMENTS

| | | | | |
|---|---|---|---|---|
| 7,557,307 | B2 * | 7/2009 | Nishizawa | .............. B32B 18/00 174/377 |
| 9,084,352 | B2 * | 7/2015 | Shinmura | ................ H04M 1/18 |
| 2010/0328903 | A1 * | 12/2010 | Nagaike | .............. G02F 1/13452 361/748 |
| 2012/0256066 | A1 * | 10/2012 | Yokawa | ................ H05K 7/1404 248/224.8 |
| 2013/0306367 | A1 * | 11/2013 | Hashi | .................... H05K 5/0091 174/549 |
| 2014/0083735 | A1 * | 3/2014 | Kohda | ..................... H03H 9/21 174/50.5 |
| 2015/0054385 | A1 * | 2/2015 | Kaida | .................. H03H 9/1021 310/344 |

(Continued)

FOREIGN PATENT DOCUMENTS

| | | |
|---|---|---|
| JP | A-6-132766 | 5/1994 |
| JP | 2004179555 A * | 6/2004 |

(Continued)

*Primary Examiner* — Jeremy C Norris
*Assistant Examiner* — Nathan Milakovich
(74) *Attorney, Agent, or Firm* — Brinks Gilson & Lione

(57) ABSTRACT

To provide a lid body portion with an improved mounting ratio of an electronic device component, an electronic device package and an electronic device including the same. There is provided a lid body portion including a concave portion in which a space portion is formed by a bottom portion and a side plate portion and a flange portion extending from an outer edge portion in an opening portion of the concave portion to the outside, in which a side-plate inner surface as a surface facing the space portion of the concave portion in the side plate portion inclines to the outside of the space portion.

10 Claims, 6 Drawing Sheets

(56) References Cited

U.S. PATENT DOCUMENTS

2015/0116971 A1* 4/2015 Kozuki .................. H05K 1/113
  361/774
2016/0021752 A1* 1/2016 Miyao ................... H05K 1/181
  361/752

FOREIGN PATENT DOCUMENTS

| JP | 2006-295246 | 10/2006 |
| JP | A-2010-278498 | 12/2010 |
| JP | A-2011-66327 | 3/2011 |

* cited by examiner

LID BODY PORTION AND ELECTRONIC DEVICE PACKAGE USING THE LID BODY PORTION AND ELECTRONIC DEVICE

RELATED APPLICATIONS

This application claims priority under 35 U.S.C. §119 to Japanese Patent Application No. 2013-147628 filed on Jul. 16, 2013, the entire content of which is hereby incorporated by reference.

BACKGROUND OF THE INVENTION

1. Field of the Invention

The present invention relates to a lid body portion and an electronic device package using the lid body portion and an electronic device.

2. Description of Related Art

In recent years, the electronic device is required to be reduced in size and height (thinned and low in height) as well as required to be highly functional.

In general, the electronic device is formed by housing an electronic device component performing a given function in an electronic device package. The electronic device package houses the electronic device component by covering part or all of a circuit substrate on which the electronic device is mounted with a lid body having a space portion.

Due to the request of reducing the size and the height of the electronic device, the space in which the electronic device component is housed inside the electronic device package is limited.

In order to mount electronic device components having many functions as many as possible or in order to mount an electronic device components having a large size due to many functions for realizing high functions of the electronic device under the space limitation, it is necessary to improve a mounting ratio of the electronic device component (the area of the electronic device component/the package area, namely, a ratio of the area of the electronic device component with respect to the area in which the electronic device component can be mounted inside the electronic device package).

Then, in order to improve the mounting ratio inside the electronic device package, a novel structure is necessary in the electronic device package.

As a structure of a related-art electronic device package, a resin-sealed package type in which a bottom surface (bottom portion) of a die pad supporting a semiconductor device is exposed is disclosed in FIG. 1 of JP-A-2011-66327 (Patent Literature 1).

In the resin-sealed package type in which the bottom surface of the die pad is exposed, an electronic device in which the size of each edge is 0.44 mm×0.44 mm is supported by the die pad in an electric device package in which the size of each edge is 0.8 mm×0.8 mm and the thickness is 0.3 mm, and the mounting ratio of the electric device component is approximately 30%.

As another structure of the electronic device package, there is a structure in which an internal electrode is provided in a base portion of a package base formed by stacking single-layer flat plates using a glass or ceramic-based material, the internal electrode is connected to an external electrode provided on a bottom surface of the base portion through a lead-wire path and the base portion is covered with a lid body.

As a related-art example of the lid body covering the base portion (a package type of the lid body covering the base portion), an example in which a glass or ceramic-based material is applied to the lid body is disclosed in Japanese Patent No. 4630110 (Patent Literature 2).

Specifically, as shown in FIG. 7, the structure of a lid body type 101 using the glass or ceramic-based material includes a flat-plate shaped base portion 103, a lid body portion 102 made of a glass or ceramic-based material and covering the base portion 103 and a bonding member 108 bonding the base portion 103 to the lid portion 102.

As the structure of the lid-body type 101 is a structure in which the above components such as an inner lead, the die pad and an outer lead are integrated into the base portion 103, the number of components included in the package is small and the electronic device component can be efficiently housed in an internal space 104 of the lid body 102.

As a related-art example of the lid body covering the base portion, examples in which a metallic material is applied to the lid body are disclosed in JP-A-6-132766 (Patent Literature 3) or JP-A-2010-278498 (Patent Literature 4).

Detailed explanation of the related-art example will be given. As shown in FIG. 8, the size relation in the structure of the internal space 104 of the lid body portion 102 in the case of the metallic lid body type is represented by a flat surface length L1 by a corner portion 114 having a curvature radius, a flat surface length L2 by a side-plate inner surface 110 having a tapered surface directed to the inside and a flat surface length L3 by a corner 115 where the side-plate inner surface 110 crosses a flange-portion flat surface 107 of the lid body portion 102.

However, in the resin-sealed package type disclosed in Patent Literature 1, the volume of the device component which can occupy the volume of the electronic device package is reduced. In particular, the mounting ratio of electronic device component occupying the package is reduced as the reduction in size and height proceeds.

Specifically, as space for arranging components such as the inner lead, the die pad and the outer lead at intervals are necessary inside the package, the ratio in which these components occupy the package volume is high, which reduces the mounting ratio of the electronic device components in the package size.

In the package of the lid-body type made of a glass or ceramic-based material disclosed in Patent Literature 2, the corner portion 114 inside the lid body portion 102 has the curvature radius in the internal space 104 of the lid body portion 102.

Then, the side-plate inner surface 110 of the lid body portion 102 has a tapered surface 110 directed to the inside of the internal space 104. Accordingly, the corner portion 114 and the side-plate inner surface 110 may contact the electronic device component, therefore, it is necessary to keep a distance from the flat surface (direction) length L1 of the corner portion 114 and the flat surface length L2 of the side-plate inner surface 110, which will be a constraint for enlarging the size of the electronic device component to be mounted.

Accordingly, it has been difficult to improve the mounting ratio of electronic device component. Additionally, there is a limit for reducing the height by uniformly thinning a thickness T3 of the lid body portion 102 made of a glass or ceramic-based material.

As the related-art example of the package type having the structure of the lid-body type made of a metal disclosed in Patent Literatures 3 and 4 has the size relation shown in FIG. 8, there is a danger that the inside (the side-plate inner surface 110 having the tapered surface directed to the inside and so on) of the lid body portion 102 contacts the electronic device component. It is generally necessary that the inside of the lid body portion 102 keeps a distance from the electronic device component and so on, which has been the constraint for enlarging the size of the electronic device component to be mounted. Accordingly, it has been difficult to improve the mounting ratio of electronic device component.

SUMMARY OF THE INVENTION

The present invention has been made in view of the above problems, and an object thereof is to provide an electronic device package with an improved mounting ratio of electronic device component and an electronic device including the same.

The above problems can be solved by the following means, which achieve the above object.

According to an embodiment of the present invention, there is provided a lid body portion including a concave portion in which a space portion is formed by a bottom portion and a side plate portion and a flange portion extending from an outer edge portion in an opening portion side of the concave portion to the outside, in which a side-plate inner surface as a surface facing the space portion of the concave portion in the side plate portion is a reverse tapered surface inclining to the outside of the space portion from the opening portion side toward the bottom portion.

In the structure according to the embodiment of the present invention, a radius of a corner portion where the flange portion crosses the side-plate inner surface may be ¼ or less of a thickness of the flange portion.

In the structure according to the embodiment of the present invention, a corner portion where the side-plate inner surface crosses a bottom-plate inner surface as a surface facing the space portion in the bottom portion may include a member-inside shape formed so as to be buried inside of the side plate portion.

In the structure according to the embodiment of the present invention, a radius of an outside corner portion where a side-plate outer surface as an outer peripheral surface side in the side plate portion crosses a bottom-plate outer surface as an outer peripheral surface side of the bottom portion may have approximately the same value as the thickness of the flange portion, and radiuses of other corners respectively formed by the crossing between the flange portion and the side plate portion and a radius of the corner portion formed by the crossing between the side-plate inner surface and the bottom-plate inner surface may be smaller than the above value.

In the structure according to the embodiment of the present invention, a thickness of the side plate portion may be thinner in a side plate thickness close to the bottom portion than in a side plate thickness close to the opening portion.

In the structure according to the embodiment of the present invention, the thickness of the side plate portion and the thickness of the bottom portion may be thinner than the thickness of the flange portion.

In the structure according to the embodiment of the present invention, the thickness of the flange portion may be 0.02 mm to 0.20 mm.

According to an embodiment of the present invention, there is provided an electronic device package including a lid body portion and a base portion having electrodes, in which a flange portion is bonded to the base portion.

In the structure according to the embodiment of the present invention, a first surface of the base portion may include an internal electrode and a second surface on the other side of the base portion may include an external electrode, a through hole may be formed in the base portion, an inner wall surface of the through hole may be covered with a metal film and the metal film may be sealed in a state where an opening portion of the through hole is filled on the second surface side, and at least a pair of the internal electrode and the external electrode may be connected to the first surface and the second surface by the metal film via the through hole connecting the first surface of the base portion to the second surface on the other side.

According to an embodiment of the present invention, there is provided an electronic device including the above electronic device package.

According to the embodiment of the present invention, the lid body portion with an improved mounting ratio of an electronic device component, an electronic device package using the lid body portion and an electronic device including the package.

BRIEF DESCRIPTION OF THE DRAWINGS

FIGS. 2A to 2C are partial enlarged views of a closing line portion X in FIG. 1, in which FIG. 2A is a partial enlarged view for explaining an example of the lid body portion, FIG. 2B is a partial enlarged view illustrating the relation of thicknesses of a bottom portion and a side plate portion and FIG. 2C is a partial enlarged view of a corner portion of the lid body portion.

FIGS. 5A to 5C are views for explaining an example in which an electronic device according to an embodiment of the present invention is applied to a semiconductor apparatus, in which FIG. 5A is a perspective view of the semiconductor apparatus according to the embodiment of the present invention, FIG. 5B is a plan view of the semiconductor apparatus according to the embodiment of the present invention and FIG. 5C is a cross-sectional view taken along A-A line of FIG. 5B.

FIGS. 6A to 6C are views for explaining an example in which an electronic device according to an embodiment of the present invention is applied to a quartz crystal unit, in which FIG. 6A is a perspective view of the quartz crystal unit according to the embodiment of the present invention, FIG. 6B is a plan view of the quartz crystal unit according to the embodiment of the present invention and FIG. 6C is a cross-sectional view taken along B-B line of FIG. 6B.

DETAILED DESCRIPTION OF THE PREFERRED EMBODIMENTS

Hereinafter, an embodiment of the present invention will be explained with reference to the drawings.

The embodiment explained below is an embodiment in a case of applying the present invention to a lid body portion, an electronic device package using the lid body portion and an electronic device including the electronic device package.

First, an electronic device package 1 having the lid body portion according to the embodiment will be explained with reference to FIG. 1.

Figure 1:
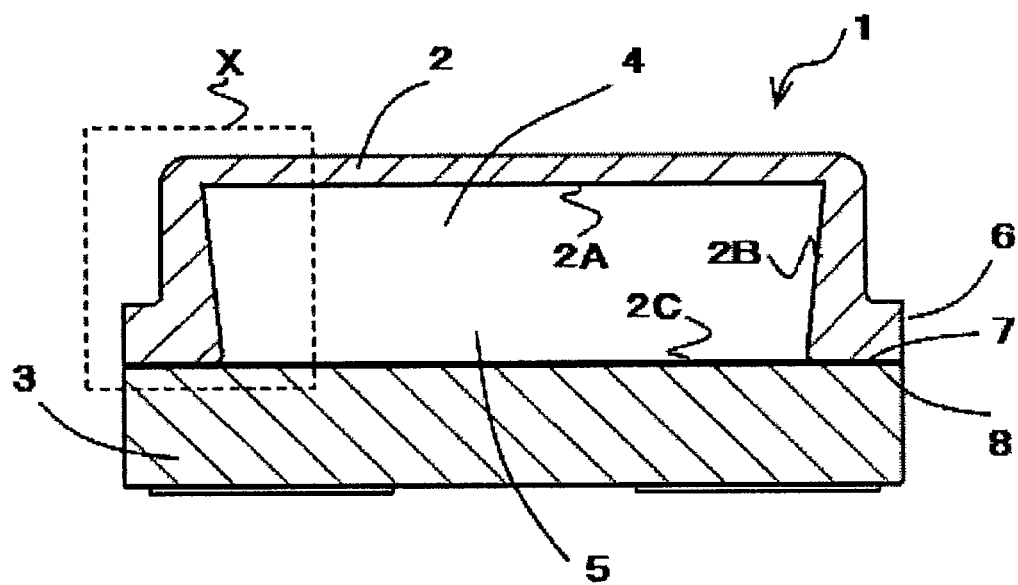
FIG. 1 is a cross-sectional view showing a schematic structure for explaining an example of an electronic device package including a lid-body portion according to an embodiment of the present invention.

FIG. 1 is a cross-sectional view showing a schematic structure for explaining an example of the electronic device package 1 including the lid-body portion according to an embodiment of the present invention.

As shown in FIG. 1, the electronic device package 1 includes a base portion 3 having a flat-plate shaped base material, a metallic lid body portion 2 and so on, which includes a concave portion 5 having a space portion 4 in which a bottom portion 2A and a side plate portion 2B extending upward (for example, a direction of the base portion 3 in FIG. 1) from the bottom portion 2A form an opening portion 2C, and a flat-surface shaped flange portion 6 extending outward from an outer peripheral portion of the concave portion 5 in the opening portion 2C side, in which the electronic device component mounted on the base portion 3 is housed in the concave portion 5 (space portion 4) by bonding the a flange-portion flat surface 7 as a flat surface portion of the flange portion 6 to the base portion 3.

Then, the flange-portion flat surface 7 and the base portion 3 are bonded by a bonding member 8 so that the entire periphery of the flange-portion flat surface 7 contacts the base portion 3.

As materials for forming the base portion 3, ceramics, glass or composite materials of them are mainly used. Ceramics include oxide-based materials typified by, for example, alumina ($Al_2O_3$), silicon carbide (SiC)-based materials, aluminum nitride (AlN)-based materials and so on, and glass includes, for example, soda-lime glass, quartz glass, borosilicate glass and so on. Composite glass including other materials, for example, inorganic fibers and so on can be also applied. It is also preferable to use a resin-based circuit substrate such as glass epoxy in addition to ceramics and glass.

As metal materials for forming the lid body portion 2, metals such as Kovar (Fe—Ni—Co alloy), 42-alloy (Fe—Ni alloy) and SUS304 (stainless steel) may be used, which have preferably the same degree of thermal expansion coefficient as the bonding member 8 such as low-melting glass and the base portion 3. The lid body portion 2 is formed by pressing these metal plates.

As the bonding member 8, for example, gold (Au)-Tin (Sn)-based and gold (Au)-nickel (Ni)-based alloys, boron oxide (BaO)-lead oxide (PbO)-based low-melting glass, lead-free type low-melting glass and so on are used.

A thickness of the base portion 3 is approximately 0.1 mm and a plate thickness of the metallic lid body portion 2 is 0.02 mm to 0.20 mm. Then, a thickness of the electronic device package 1 is within 0.6 mm, and preferably thinned to approximately 0.3 mm in the case of packages for a quartz crystal unit and for a semiconductor apparatus used for a cellular phone and so on.

As has been already explained, a housing portion for housing an electronic device component 50, which includes the base portion 3, the lid body portion 2, the bonding member 8 and so on as shown in FIG. 1 is referred to as the electronic device package 1.

Figure 3:
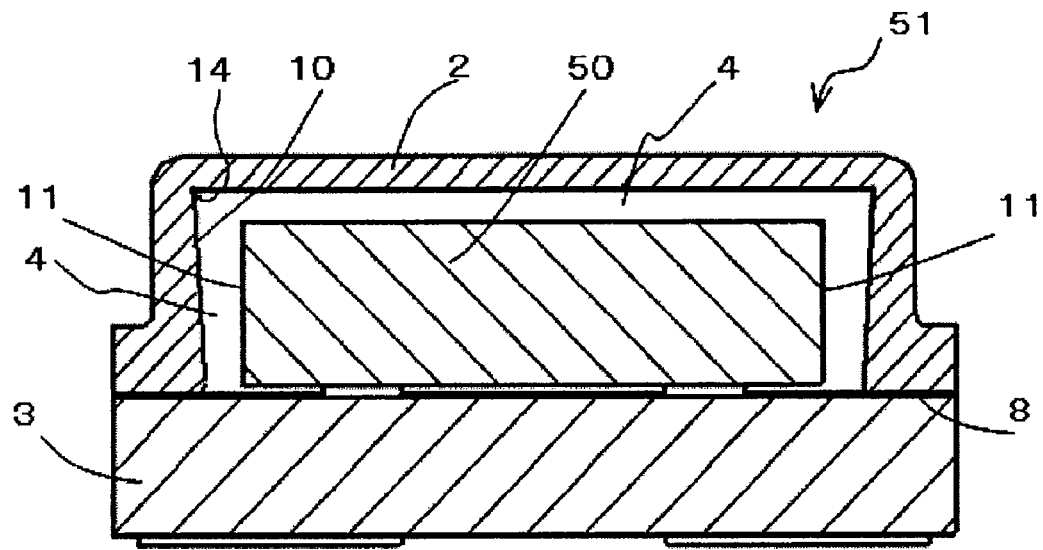
FIG. 3 is a cross-sectional view showing an example in which an electronic device component is housed inside the electronic device package according to the embodiment of the present invention.

As the electronic device component 50, for example, a quartz crystal blank, a semiconductor device or the like can be used as shown in FIG. 3 later. For example, when the electronic device component 50 is the quartz crystal blank, an electronic device 51 will be the quartz crystal unit. When the electronic device component 50 is the semiconductor device, the electronic device 51 will be the semiconductor apparatus.

The quartz crystal blank, the semiconductor device or the like is mounted on the base portion 3 and housed inside the lid body portion 2 of the electronic device package 1, thereby forming the electronic device 51. When the electronic device component 50 is a MEMS device (for example, an acceleration sensor device and the like), the electronic device will be an acceleration sensor and the like.

Next, the lid body portion 2 of the electronic device package 1 according to an embodiment of the present invention will be explained based on FIGS. 2A to 2C and FIG. 3.

Figure 2A:
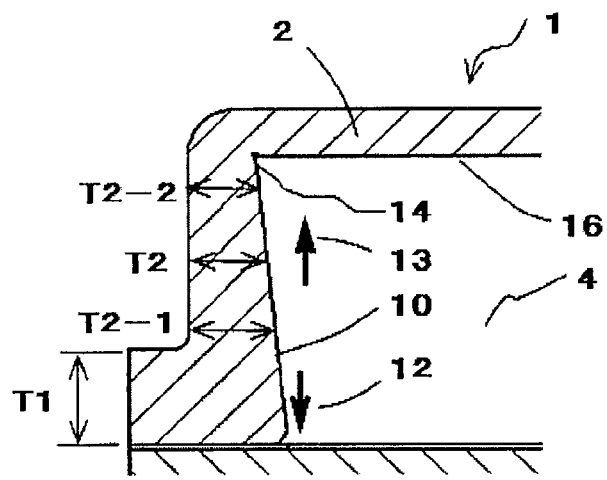
Figure 2B:
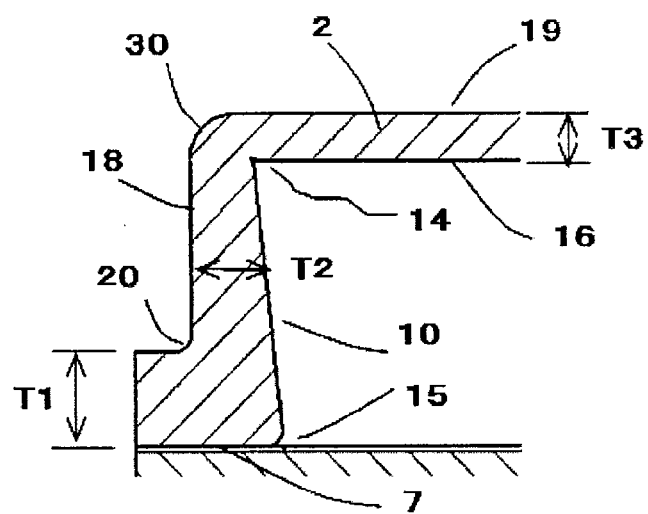
Figure 2C:
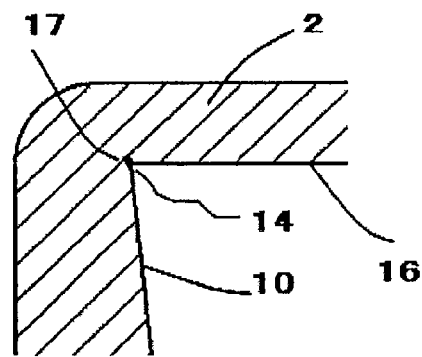

FIGS. 2A to 2C are partial enlarged views of a closing line portion X in FIG. 1, in which FIG. 2A is a partial enlarged view for explaining an example of the lid body portion 2, FIG. 2B is a partial enlarged view illustrating the relation of thicknesses of the bottom portion 2A and the side plate portion 2B, and FIG. 2C is a partial enlarged view of a corner portion 14 of the lid body portion 2. FIG. 3 is a cross-sectional view showing an example in which the electronic device component 50 is housed inside the electronic device package 1 according to the embodiment of the present invention.

As shown in FIG. 2A, a side-plate inner surface 10 which is a surface facing the space portion 4 in the side plate portion 2B according to the embodiment (side-plate inner surface inside the side plate of the lid body portion 2 in the electronic device package 1 according to the present invention) is formed by a reverse tapered surface inclining to the outside of the space portion 4 from the opening portion 2C toward the bottom portion 2A.

In other words, the side-plate inner surface 10 is formed by the reverse tapered surface with an angle extending from an opening portion side 12 of the side plate portion 2B toward a bottom-plate inner surface 16 of the bottom portion 2A of the side plate portion 2B.

Figure 8:
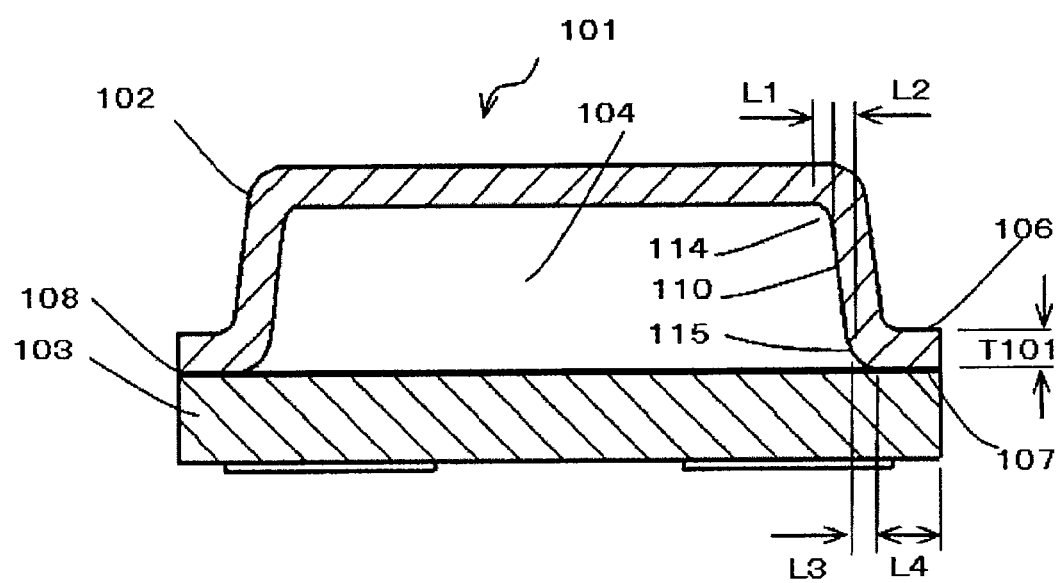
FIG. 8 is a cross-sectional view of a lid body type made of a metal as a related art example of an electronic device package.

As the related-art lid body portion 102 has the flat surface length L1 by the corner portion 114 having the curvature radius inside the internal space 104 of the lid body portion 102 and the flat surface length L2 by the side-plate inner surface 110 having the tapered surface directed to the inside according to the normal plastic working in related art as shown in FIG. 8 described above, there is a danger that the lid body portion 102 contacts the electronic device component.

In response to this, the side plate inner surface 10 is formed to be the reverse tapered surface inclining to the outside of the space portion 4 from the opening portion 2C toward the bottom portion 2A, thereby providing a given gap between the side plate inner surface 10 of the lid body portion 2 and a side surface 11 of the electronic device component 50, as a result, the space portion 4 is widened (expanded).

More specifically, the corner portion 14 of the side-plate inner surface 10 of the lid body portion 2 can keep a distance from the electronic device component 50 to be housed in the space portion 4 of the lid body portion 2 as shown in FIG. 3 and a contact with respect to the electronic device component 50 can be prevented.

Here, the corner portion 14 indicates a corner portion where the side-plate inner surface 10 of the lid body portion 2 crosses the bottom-plate inner surface 16 as a surface facing the space portion 4 in the bottom portion 2A.

Though the angle range of the reverse tapered surface of the side-plate inner surface 10 can be arbitrarily set, the range is preferably from an angle perpendicular to the flange-portion flat surface 7 (a vertical direction with respect to the bottom portion 2A) to an angle 0 to 5 degrees inclined to the direction of the side-plate inner surface (a range of −5 degrees to the side-plate inner surface 10).

As the side-plate inner surface 10 of the lid body can keep a distance from the electronic device component 50 by the above structure, the contact with respect to the side surface 11 of the electronic device component 50 can be prevented.

Then, the capacity in which the electronic device component can be housed in the space portion 4 of the lid body portion 2 of the package can be maximized.

Accordingly, it is possible to provide the electronic device package with the improved mounting ratio of the electronic device component, in which the distance between the side-plate inner surface 10 and the inside side surface 11 in the electronic device component 50 is minimized and the size of the electronic device component 50 is maximized to thereby increase the area occupied by the electronic device component (the area in which the electronic device component can be mounted in the base portion 3).

The corner portion of the inner wall surface of the lid-body concave portion in related art exists inside the lid-body concave portion with a commensurate curvature radius and may contact the electronic device component, however, it is possible to allow the electronic device component to keep a distance from the side-plate inner surface and prevent the contact with respect to the electronic device component by forming the side plate portion 2B to be the reverse tapered surface 10 inclining to the outside of the space portion 4 from the opening portion 2C toward the bottom portion 2A.

More specifically, the space portion 4 increased by the structure is given to the area occupied by the electric device component 50, minimizing the distance between the side-plate inner surface 10 of the lid body 2 and the side surface 11 of the electronic device component 50 as well as maximizing the size of the electronic device component 50 to thereby increase the area ratio occupied by the electronic device component 50 and to increase the mounting ratio (electronic device component area/package area) of the electronic device component 50.

That is, the capacity of housing the electronic device component is increased, the distance between the side-plate inner surface 10 and the side surface 11 of the electronic device component 50 is minimized and the size of the electronic device component is maximized, thereby increasing the area occupied by the electronic device component and improving the mounting ratio.

Moreover, the flange-portion flat surface 7 can be provided to have a wide area toward the direction of the space portion 4. Accordingly, as the contact area between the base portion 3 and the flange-portion flat surface 7 is increased, the reliability in connection between the base portion 3 and the lid body portion 2 can be secured, which realizes further reduction in size and height of the electronic device.

The above point will be explained in detail.

The related-art example of the package type having the structure using the metallic lid body type disclosed in the above-described Patent Literatures 3 and 4 has the following respective problems: The mounting ratio of the electronic device component is reduced as a first problem, it is difficult to secure (the area) the reliability in connection between the base portion and the lid body portion as a second problem, and the reduction in size and height of the electronic device package becomes difficult as one edge the package is reduced to be lower than 1 mm and the height is lower than 0.4 mm as a third problem.

Specifically, in the related-art package 101 having the structure of bonding the lid body portion 102 with a flange portion 106 as shown in FIG. 8, the corner 115 where the side-plate inner surface 110 crosses a flange-portion flat surface 107 of the lid body portion 102 has a radius size corresponding to a flange portion thickness T101 which is equivalent to the material thickness or more in the normal plastic working in related art. This is an unnecessary length not contributing to the prevention of contact with respect to the electronic device component and the securement of the necessary bonding area and bonding strength. The securement of the necessary bonding area and bonding strength is realized only by a length L4 of the flange-portion flat surface 107 prepared in the lid body portion 102.

Accordingly, in order to prevent the contact with respect to the electronic device component and to secure the necessary bonding area and bonding strength in related art, the length L1 by the corner portion 114, the length L2 by the side-plate inner surface 110, the length L3 by the corner 115 and the length L4 by the flange-portion flat surface 107 are necessary. As the package is reduced in size, the ratio in which the length (L1+L2+L3+L4) occupies the package becomes prominent, and it is difficult to secure the necessary bonding area and bonding strength to be allocated to the length L4.

However, the side plate portion 2B is formed to be the reverse tapered surface 10 inclining to the outside of the space portion 4 from the opening portion 2C toward the bottom portion 2A, thereby securing the reliability in connection between the base portion and the lid body portion as well as realizing further reduction in size and height of the electronic device.

A radius of the corner portion 15 where the flange-portion flat surface 7 crosses the side-plate inner surface 10 may be ¼ or less of the size of the flange portion thickness T1 which is the thickness of the flange portion as shown in FIG. 2B.

The (size of) radius of the corner portion 15 where the flange-portion flat surface 7 and the side-plate inner surface 10 is the same as the size of the flange-portion thickness T1 or more in related art. As shown in FIG. 8 described above, the radius of the corner 115 in related art is the flat surface length L3.

On the other hand, when the radius of the corner portion 15 crossing the side-plate inner surface 10 is formed to be ¼ or less of the flange portion thickness T1, a bonding width which is approximately ¾ or more of the flange portion thickness T1 appears. The bonding width can be utilized as the bonding area.

To secure the size in the area of the flange-portion flat surface 7 is directly connected to the improvement of important reliability in connection between the base portion 3 and the lid body portion 2 which is responsible for the bonding strength as an enlarged bonding area in which the base portion 3 is covered with the flange portion 6.

The bonding width of the flange-portion flat surface 7 in the flange portion opening portion side 12 covering the base portion 3 can be utilized as an increased bonding width which is approximately ¾ or more of the flange portion thickness T1 except the corner radius portion which is ¼ or less of the flange portion thickness T1.

Accordingly, as the bonding width between the base portion 3 and the lid body portion 2, the necessary bonding area can be secured as the bonding width which is approximately ¾ or more of the flange portion thickness T1 is added to the flange portion flat surface 7. The reliability in connection between the base portion 3 and the lid body portion 2 can be increased by securing the positive bonding area and the bonding strength.

As shown in FIG. 2C, the corner portion 14 where the side-plate inner surface 10 crosses the bottom-plate inner surface 16 of the lid body portion 2 may include a member inside shape 17 formed so as to be buried inside of the lid body portion 2 (in other words, the member inside shape 17 is formed so as to sink into the member forming the lid body portion 2 (the side plate portion 2B, the bottom portion 2A and the like)).

In other words, the corner portion 14 where the side-plate inner surface 10 crosses the bottom-plate inner surface 16 of the lid body portion 2 includes the member inside shape 17 crossing in the state of entering toward the inside of the member in the lid body portion 2.

Here, the member inside shape 17 crossing in the state of entering toward the inside of the member in the lid body portion 2 is not the related-art shape in which the corner portion 14 is formed inside the space portion 4 of the lid body 2 (inside the lid body concave portion) but a shape in which the corner portion 14 is formed toward the inside of the member of the lid body portion 2, which is the opposite side of the space portion 4 of the lid body 2 (inside the lid body concave portion).

In the corner portion 14 where the side-plate inner surface 10 crosses the bottom-plate inner surface 16 at the time of plastic working for forming the concave portion 5 of the lid body portion 2, adjacent material compositions of the lid body in the side-plate inner surface 10 and the bottom-plate inner surface 16 are compressed depending on a processing method, and the member inside shape 17 is formed in the state of entering toward the inside of the member in the lid body portion 2. The member inside shape 17 is not a shape generated due to a crack or a break in the lid body material but is formed by adjacent material compositions of the lid body being continuously compressed, therefore, the strength, airtightness and so on are secured.

As the corner portion 14 including the member inside shape 17 crossing in the state of entering toward the inside of the member in the lid body portion 2 is formed, the shape in which the contact with respect to the electronic device component 50 can be positively prevented (shape of positive contact prevention) can be formed without forming the corner-portion radius shape in the space portion 4 inside the lid body concave portion.

In addition to the effect of preventing the contact (effect of positively preventing the contact with respect to the electronic device component 50) by forming the side-plate inner surface 10 described above to be the reverse tapered surface, the certainty of the shape not contacting the corner of the electronic device component 50 is obtained without reducing the capacity of housing the electronic device component 50, thereby preventing the contact between the side-plate inner surface 10 of the lid body portion 2 and the electronic device component 50.

As shown in FIG. 2A, a thickness T2 of the side plate 2B of the lid body portion 2 may be formed to be thinner in a side plate thickness T2-2 close to the bottom portion than in a side plate thickness T2-1 close to the opening portion 2C of the flange portion 6.

When the side plate thickness T2-1 close to the opening portion 2C of the lid body portion 2 is formed to be thick almost equivalent to the flange portion thickness T1, the bonding width of the lid body portion 2 is increased. When the side plate thickness T2-2 close to a bottom-plate inner side 13 is formed to be thinner, the corner portion 14 of the side-plate inner surface 10 keeps away from the electronic device component 50. Accordingly, both shape functions can be made efficient (both effects) in the contact prevention between the lid body portion 2 (side-plate inner surface 10 and so on) and the electronic device component 50 and in the increase of the bonding area between the lid body portion 2 and the base portion 3.

According to the above, the bonding area between the lid body portion 2 and the base portion 3 can be secured, the contact between the lid body portion 2 and the electronic device component 50 can be prevented, and further, the range of housing the electronic device component 50 in the space portion 4 formed in the concave portion 5 of the lid body portion 2 (the capacity of housing the electronic device component 50) can be maximized, therefore, the electronic device package in which the reliability in connection between the base portion and the lid body portion as well as the mounting ratio of the electronic device component are improved.

As shown in FIG. 2B, the thickness T2 of the side plate 2B of the lid body portion 2 and the thickness T3 of the bottom portion 2A can be thinner than the thickness T1 of the flange portion 6.

When both the thickness T2 of the side plate 2B of the lid body portion 2 and the thickness T3 of the bottom plate are formed to be thinner than the thickness T1 of the flange portion, the corner portion 14 of the side-plate inner surface 10 keeps away from the electronic device component 50, therefore, the space which can house the electronic device component 50 is increased in the direction of the flange-portion flat surface 7 of the lid body portion 2.

As the bottom-plate inner surface 16 keeps away from the electronic device component 50, the space which can house the electronic device component 50 is increased in the direction of the thickness T3 of the bottom plate.

Accordingly, the lid body portion 2 can be reduced by an increase of the space portion 4 in the direction of the flange-portion flat surface 7 and an increase of the space portion 4 in the direction of the thickness T3 of the bottom plate in the space portion 4.

As the lid body portion 2 can be reduced in the electronic device to which the same kind of electronic device component 50 is applied, the electronic device package 1 with reduced size and height can be provided.

As shown in FIG. 2B, a radius of an outside corner portion 30 where a side-plate outer surface 18 as an outer peripheral surface side in the side plate portion 2B crosses a bottom-plate outer surface 19 as an outer peripheral surface side in the bottom portion 2A has approximately the same value as the flange-portion thickness T1 as the thickness of the flange portion 6. Radiuses of other corners respectively formed by the crossing between the flange portion 6 and the side plate 2B and the radius of the corner formed by the crossing between the side-plate inner surface 10 and the bottom-plate inner surface 16 are smaller than the above value.

Here, other corners indicate the corner portion 14 where the side-plate inner surface 10 crosses the bottom-plate inner surface 16, the corner portion 15 where the flange-portion flat surface 7 to be bonded crosses the side-plate inner surface 10 and a corner portion 20 where an opposite surface of the flange-portion flat surface 7 (a surface opposite to the bonding surface of the flange-portion flat surface 7) crosses the side-plate outer surface 18.

An outside radius (radius value) of the corner portion 30 where the side-plate outer surface 18 crosses the bottom-plate outer surface 19 of the lid body portion 2 is approximately the same (the maximum outside radius) as the value of the flange-portion thickness T1. Then, radius values of the corner portion 14 where the side-plate inner surface 10 crosses the bottom-plate inner surface 16, the corner portion 15 where the flange-portion flat surface 7 to be bonded crosses the side-plate inner surface 10 and the corner portion 20 where the opposite surface of the flange-portion flat surface 7 crosses the side-plate outer surface 18 are set to be approximately smaller than the value of the flange-portion thickness T1, preferably the minimum value (minimum radius).

Here, as the minimum value, for example, the minimum bending angle in the sheet metal processing is applied.

To set the radius value of the corner portion 14 where the side-plate inner surface 10 crosses the bottom-plate inner surface 16 to the minimum value has effects of preventing the contact between the side-plate inner surface 10 of the lid body portion 2 and the electronic device component 50 and increasing the housing capacity (increasing the space which can house the electronic device component 50 in the internal space 4).

To set the radius value of the corner portion 15 where the flange-portion flat surface 7 to be bonded crosses the side-plate inner surface 10 to the minimum value has an effect of increasing the bonding area between the base portion 3 and the lid body portion 2 covering the base body portion 3. To set the corner portion 20 where the opposite surface of the flange-portion flat surface 7 crosses the side-plate outer surface 18 to the minimum value has an effect of increasing the area of a flat surface of a pressure portion necessary when performing bonding between the base portion 3 and the lid body portion 2.

According to the above structure, the bonding area between the base portion 3 and the lid body portion 2 covering the base body portion 3 can be secured, the contact with respect to the electronic device component 50 can be prevented and the housing capacity of the electronic device component 50 of the concave portion 5 of the lid body portion 2 can be maximized. Then, the electronic device package 1 in which the reliability in connection between the base portion 3 and the lid body portion 2 and the mounting ratio of the electronic device component 50 are improved can be obtained. Note that the flange-portion thickness T1 is set to 0.02 mm to 0.20 mm as shown in FIG. 2B.

In the related-art package, the volume of the device occupying the volume of the electronic device package is small, and factors thereof are the shape and the thickness of the lid body portion occupying the volume.

In response to this, the thickness of the lid body portion for reducing the size and height of the electronic device is preferably 0.02 mm to 0.20 mm as the ratio in which the shape and the thickness of the lid body portion 2 occupy the volume is increased as the size is reduced.

Accordingly, it is possible to provide the extremely advantageous small-sized electronic device package 1 by allowing the volume ratio of the electronic device component 50 with respect to the size of the electronic device package 1 to be the most efficient in this range. When the thickness is 0.20 mm or more, the effect of increasing the volume ratio of the electronic device component 50 is reduced, and when the thickness is 0.02 mm or less, the strength of the lid body is reduced, which makes the invention impractical.

Next, the base portion 3 according to the embodiment of the present invention will be explained with reference to the drawings.

Figure 4:
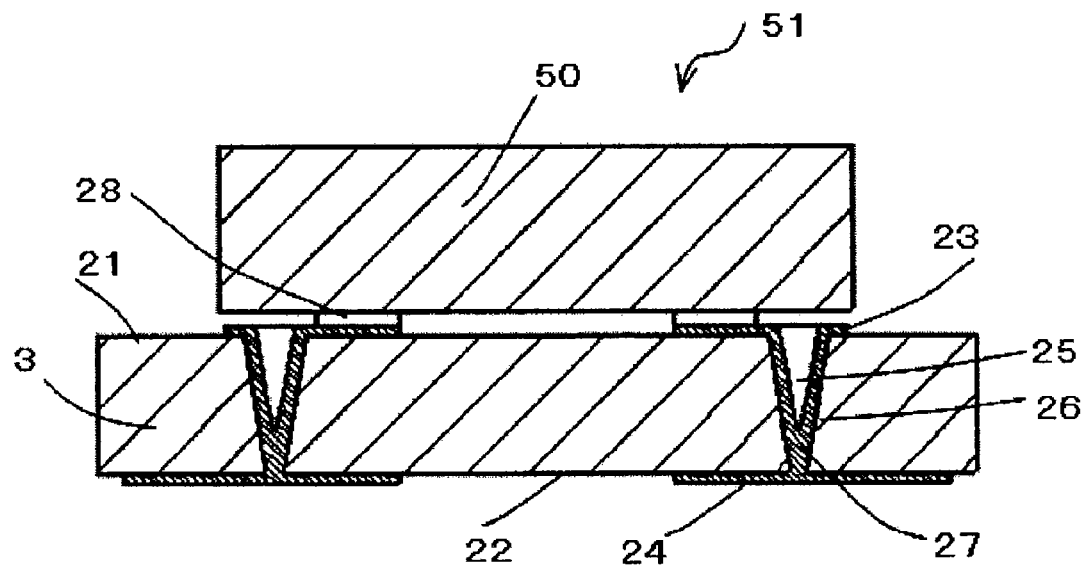
FIG. 4 is a cross-sectional enlarged view for explaining an example of a base portion according to an embodiment of the present invention.

FIG. 4 is a cross-sectional enlarged view for explaining an example of the base portion 3 according to an embodiment of the present invention.

As shown in FIG. 4, a first surface 21 of the base portion 3 includes an internal electrode 23, a second surface 22 on the other side of the base portion 3 includes an external electrode 24 and a through hole 25 is formed in the base portion 3.

A diameter of the through hole 25 is in a range of 40 to 150 μm as an opening diameter of the through hole 25 on the first surface 21 side, and is in a range of 10 to 40 μm as an opening diameter of the through hole 25 on the second surface 22 side.

An inner wall surface of the through hole 25 is covered with a metal film 26, and the metal film 26 is sealed in a state where an opening portion 27 of the through hole 25 is filled on the second surface 22 side.

As a member of the metal film 26, for example, members made of metal materials such as gold and copper can be used. As the through hole 25 is filled with the member of the metal film 26, the inside airtightness can be maintained in a good condition.

The electronic device component 50 is connected to the internal electrode 23 on the first surface 21 side by a bonding member 28 such as a conductive adhesive, solder and gold bumps.

The internal electrode 23 on the first surface 21 side is connected to the through hole 25 on the first surface 21 side as rearrangement wiring corresponding to the electronic device component 50.

At least a pair of the internal electrode 23 and the external electrode 24 is connected to the first surface 21 and the second surface 22 by the metal film 26 via the through hole 25 connecting the first surface 21 of the base portion 3 to the second surface 22 on the other side.

The electronic device 51 (the lid body portion 2 and the bonding member 8 are not shown in FIG. 4) performs output to the outside from the electronic device component 50 via the bonding member 28, the internal electrode 23, the metal film 26 of the through hole 25 and the external electrode 24.

Though the base portion 3 forms the through hole 25 in a material as a single layer, and the wiring and the electrodes are formed on the first surface 21 and the second surface 22 in FIG. 4, it is also preferable to apply a structure, for example, in which the base portion 3 uses a ceramic or resin-based multilayer substrate and has wiring layers in the upper and lower surfaces and an intermediate layer and interlayer electrical connection means.

According to the above, it is possible to provide the base portion 3 in which the internal electrode 23 on the first surface 21 having the degree of freedom in wiring of the rearrangement wiring corresponding to the electronic device component 50 is connected to the external electrode 24 on the second surface 22 which is the wiring to a substrate mounting side.

Next, a semiconductor apparatus 52 as an example of a semiconductor device according to an embodiment of the present invention will be explained.

Figure 5A:
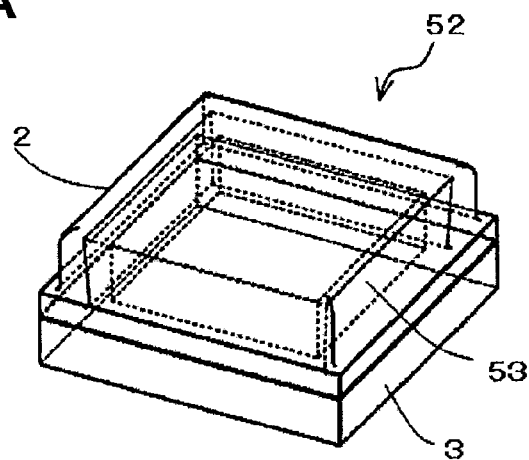
Figure 5B:
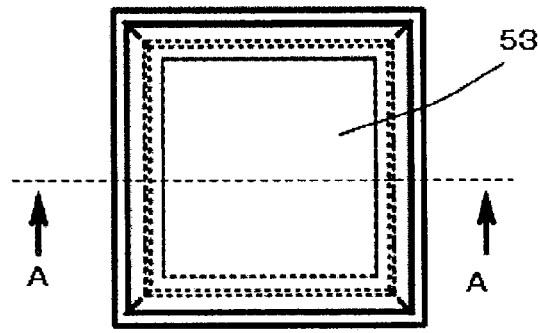
Figure 5C:
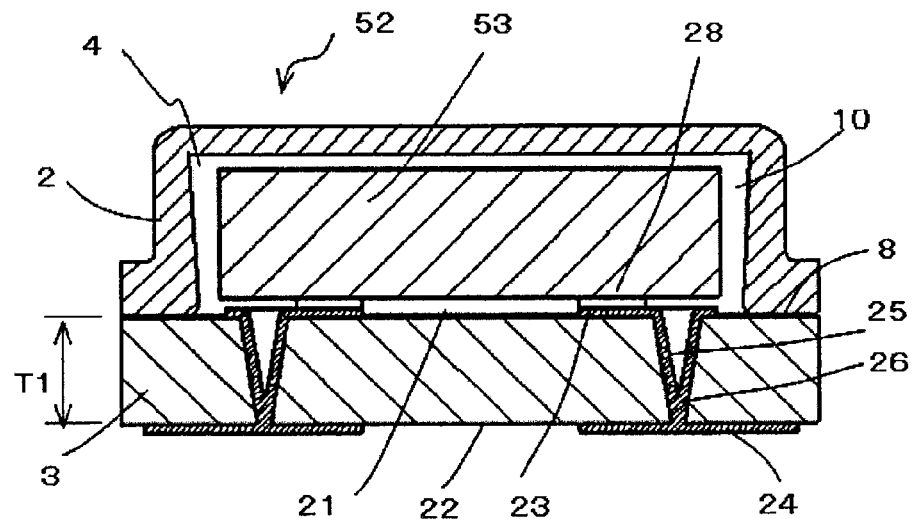

FIGS. 5A to 5C are views for explaining an example in which an electronic device according to an embodiment of the present invention is applied to the semiconductor apparatus 52, in which FIG. 5A is a perspective view of the semiconductor apparatus according to the embodiment of the present invention, FIG. 5B is a plan view of the semiconductor apparatus according to the embodiment of the present invention and FIG. 5C is a cross-sectional view taken along A-A line of FIG. 5B.

The same symbols are given to portions common to the above embodiment and the detailed explanation is omitted. The explanation will be made with a focus on portions different from the above embodiment.

As shown in FIG. 5C, the semiconductor apparatus 52 includes the base portion 3, the metallic lid body portion 2 and the bonding member 8, in which a semiconductor device 53 is connected to the internal electrode 23 on the first surface 21 side of the base portion 3 in the internal space 4 inside the lid body concave portion by the bonding member 28 such as gold bumps.

The internal electrode 23 on the first surface 21 side is connected to the metal film 26 of the through hole 25 and to the external electrode 24 as the rearrangement wiring corresponding to the semiconductor device 53.

The semiconductor apparatus 52 performs output to the outside from the semiconductor device 53 via the bonding member 28, the internal electrode 23, the metal film 26 of the through hole 25 and the external electrode 24.

The concave portion side inner wall surface 10 of the lid body portion 2 keeps away from the semiconductor device 53 to thereby prevent the contact with respect to a side surface of the semiconductor device 53, and the housing capacity of the semiconductor device 53 which forms the concave portion internal space 4 of the package lid body portion 2 is maximized. The area occupied by the semiconductor device 53 is increased by minimizing the distance between the side-plate inner surface 10 and the side surface of the semiconductor device 53 and by maximizing the size of the semiconductor device 53 to form the semiconductor apparatus 52 in which the mounting ratio of the semiconductor device 53 is improved.

The bonding area and bonding strength between the base portion 3 and the lid body portion 2 covering the base portion 3 are secured to form the semiconductor apparatus 52 in which the reliability in connection between the base portion 3 and the lid body portion 2 is increased.

Additionally, the increase of the housing capacity of the semiconductor device 53 is devoted to the size reduction of the package and the height reduction of the package by setting the flange portion T1 to 0.02 mm to 0.20 mm, thereby realizing the semiconductor apparatus 52 in which the size and height are further reduced.

It is possible to provide the semiconductor apparatus 52 in which the internal electrode 23 on the first surface 21 of the base portion 3 having the degree of freedom in wiring of the rearrangement wiring corresponding to the semiconductor apparatus 53 is connected to the external electrode 24 on the second surface 22 which is the wiring to a substrate mounting side.

A specific example of the semiconductor apparatus 52 according to the embodiment aiming to reduce size and increase the mounting ratio will be explained. The semiconductor apparatus 52 which is extremely small in size and has high mounting ratio can be realized by setting the size of each edge of the electronic device package 1 to 0.6 mm×0.6 mm, the size of each edge of the semiconductor device 53 to 0.45 mm×0.45 mm, the mounting ratio of the semiconductor device 53 to 56% or more and the thickness to 0.3 mm.

As described above, it is possible to provide the semiconductor apparatus 52 realizing reduction in size and height and having high mounting ratio of the semiconductor device 53 and high reliability in connection between the base portion 3 and the lid body portion 2 as the semiconductor apparatus 52 according to the present embodiment.

Next, a quartz crystal unit 54 as an example of a quartz crystal device according to an embodiment of the present invention will be explained.

Figure 6A:
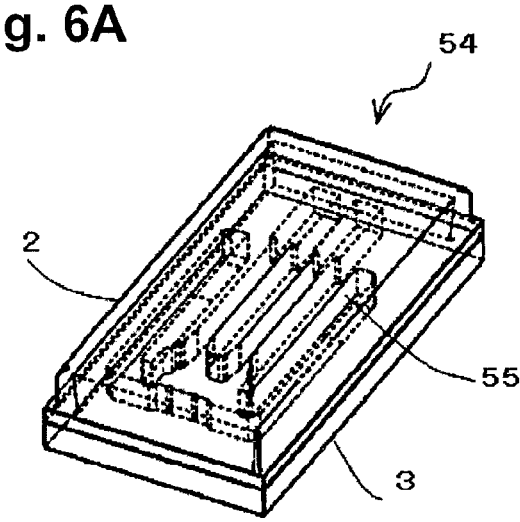
Figure 6B:
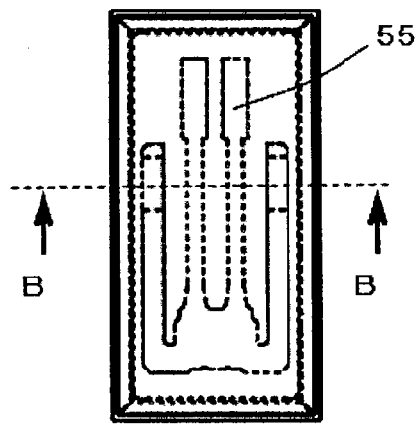
Figure 6C:
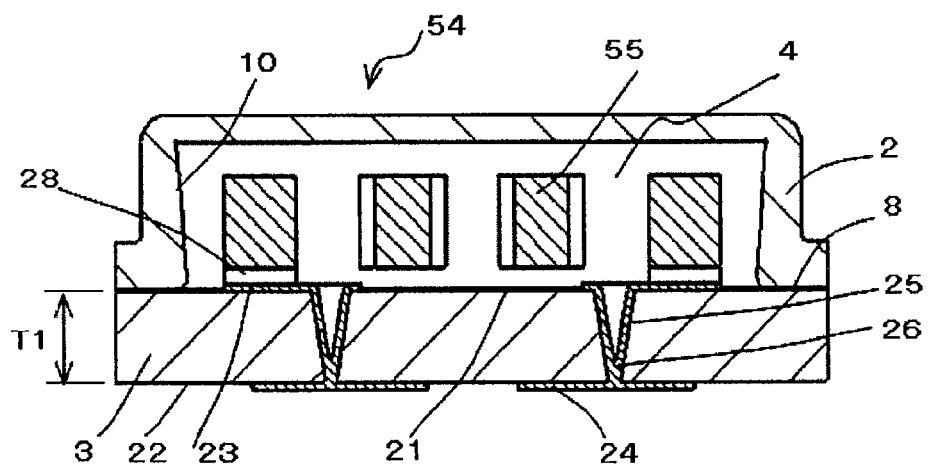
Figure 7:
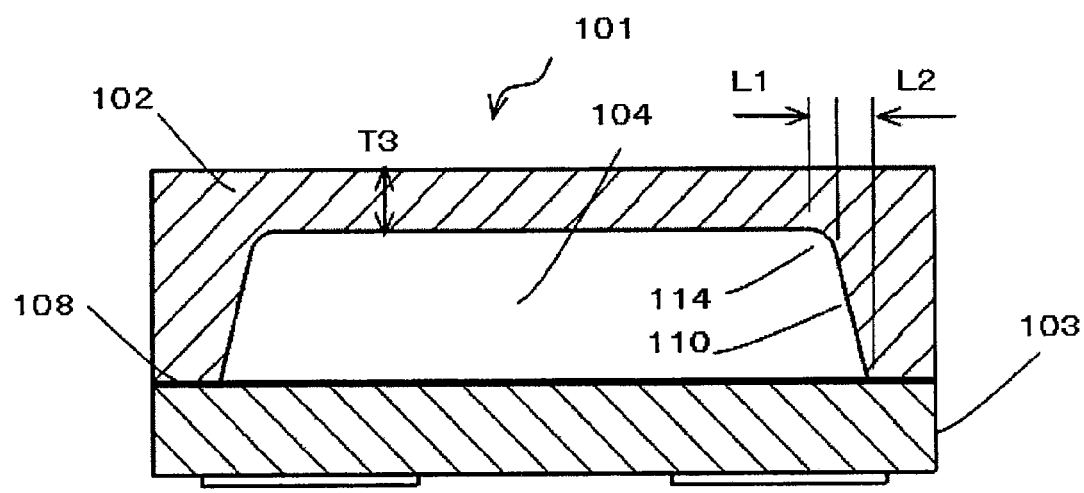
FIG. 7 is a cross-sectional view of a lid body type made of a glass or ceramic-based material as a related art example of an electronic device package.

FIGS. 6A to 6C are views for explaining an example in which an electronic device according to an embodiment of the present invention is applied to the quartz crystal unit 54, in which FIG. 6A is a perspective view of the quartz crystal unit according to the embodiment of the present invention, FIG. 6B is a plan view of the quartz crystal unit according to the embodiment of the present invention and FIG. 6C is a cross-sectional view taken along B-B line of FIG. 6B.

As shown in FIG. 6C, the quartz crystal unit 54 includes the base portion 3, the metallic lid body portion 2 and the bonding member 8, in which a quartz crystal blank 55 is connected to the internal electrode 23 on the first surface 21 side of the base portion 3 in the internal space 4 inside the lid body concave portion by the bonding member 28 such as gold bumps.

The internal electrode 23 on the first surface 21 side is connected to the metal film 26 of the through hole 25 and to the external electrode 24 as the rearrangement wiring corresponding to the quartz crystal blank 55.

The quartz crystal unit 54 performs output to the outside from the quartz crystal blank 55 via the bonding member 28, the internal electrode 23, the metal film 26 of the through hole 25 and the external electrode 24.

The contact with respect to a side surface of the quartz crystal blank 55 which keeps a distance from the side-plate inner surface 10 of the lid body portion 2 is prevented, and the housing capacity of the quartz crystal blank 55 which forms the concave portion internal space 4 of the package lid body portion 2 is maximized. The area occupied by the quartz crystal blank 55 is increased by minimizing the distance between the side-plate inner surface 10 and the side surface of the quartz crystal blank 55 and by maximizing the size of the quartz crystal blank 55 to form the quartz crystal unit 54 in which the mounting ratio of the quartz crystal blank 55 is improved.

The quartz crystal unit 54 in which the bonding area and bonding strength between the base portion 3 and the lid body portion 2 covering the base portion 3 are secured to form the quartz crystal unit 54 in which the reliability in connection between the base portion 3 and the lid body portion 2 is increased.

Additionally, the increase of the housing capacity of the quartz crystal blank 55 is devoted to the size reduction of the package and the height reduction of the package by setting the flange portion T1 to 0.02 mm to 0.20 mm, thereby realizing the quartz crystal unit 54 in which the size and height are further reduced.

It is possible to obtain the quartz crystal unit 54 in which the internal electrode 23 on the first surface 21 of the base portion 3 having the degree of freedom in wiring is used as the rearrangement wiring corresponding to the quartz crystal blank 55, and the wiring to the substrate mounting side is connected to the external electrode 24 on the second surface 22.

A specific example of the quartz crystal unit 54 according to the embodiment aiming to reduce size and increase the mounting ratio will be explained. The quartz crystal unit 54 which is extremely small in size and has high mounting ratio can be realized by setting the mounting ratio in the electronic device package 1 to 54% or more and setting the thickness to 0.3 mm, whereas the size of respective edges of the related-art electronic device package called a 2012 type is 2.00 mm×1.2 mm and the mounting ratio of the quartz crystal blank 55 is 32%.

As a manufacturing method of the lid body portion 2 according to the embodiment, a drawing process, a so-called die casting using a mold having a slide structure and so on can be applied.

Though a metallic material is applied to the lid body portion 2 according to the embodiment, it is not limited to this, and for example, resins such as ABS (a copolymer synthetic resin of acrylonitrile, butadiene and styrene) and PC (polycarbonate) may be applied.

The above explained embodiments do not limit the inventions described in claims.

Then, all combinations of structures explained in the above embodiments are not inevitable means for solving the problems in the invention. The structures explained in the above embodiments can be realized by being suitably combined.

What is claimed is:

1. A lid body portion comprising:
   a concave portion in which a space portion is formed by a bottom portion and a side plate portion; and
   a flange portion extending from an outer edge portion in an opening portion side of the concave portion to the outside,
   wherein a side-plate inner surface as a surface facing the space portion of the concave portion in the side plate portion is a reverse tapered surface inclining to the outside of the space portion from the opening portion side toward the bottom portion.

2. The lid body portion according to claim 1,
   wherein a radius of a corner portion where the flange portion crosses the side-plate inner surface is ¼ or less of a thickness of the flange portion.

3. The lid body portion according to claim 1,
   wherein a corner portion where the side-plate inner surface crosses a bottom-plate inner surface as a surface facing the space portion in the bottom portion includes a member-inside shape formed so as to be buried inside of the lid body portion.

4. The lid body portion according to claim 3,
   wherein a radius of an outside corner portion where a side-plate outer surface as an outer peripheral surface side in the side plate portion crosses a bottom-plate outer surface as an outer peripheral surface side of the bottom portion has approximately the same value as the thickness of the flange portion, and
   radiuses of other corners respectively formed by the crossing between the flange portion and the side plate portion and a radius of the corner portion formed by the crossing between the side-plate inner surface and the bottom-plate inner surface are smaller than the above value.

5. The lid body portion according to claim 1,
   wherein a thickness of the side plate portion is thinner in a side plate thickness close to the bottom portion than in a side plate thickness close to the opening portion.

6. The lid body portion according to claim 1,
   wherein the thickness of the side plate portion and the thickness of the bottom portion are thinner than the thickness of the flange portion.

7. The lid body portion according to claim 1,
   wherein the thickness of the flange portion is 0.02 mm to 0.20 mm.

8. An electronic device package comprising:
   a lid body portion according to claim 1; and
   a base portion having electrodes,
   wherein the flange portion is bonded to the base portion.

9. The electronic device package according to claim 8,
   wherein a first surface of the base portion includes an internal electrode and a second surface on the other side of the base portion includes an external electrode,
   a through hole is formed in the base portion, an inner wall surface of the through hole is covered with a metal film and the metal film is sealed in a state where an opening portion of the through hole is filled on the second surface side, and
   at least a pair of the internal electrode and the external electrode is connected to the first surface and the second surface by the metal film via the through hole connecting the first surface of the base portion to the second surface on the other side.

10. An electronic device comprising:
    an electronic device package according to claim 8.

* * * * *